United States Patent [19]

Miller et al.

[11] Patent Number: 4,514,651

[45] Date of Patent: Apr. 30, 1985

[54] ECL TO TTL OUTPUT STAGE

[75] Inventors: Ira Miller, Tempe; Michael W. Null, Mesa, both of Ariz.

[73] Assignee: Motorola, Inc., Schaumburg, Ill.

[21] Appl. No.: 450,415

[22] Filed: Dec. 16, 1982

[51] Int. Cl.³ .............. H03K 19/092; H03K 19/088; H03K 19/086

[52] U.S. Cl. .................. 307/475; 307/264; 307/456

[58] Field of Search ............. 307/455, 456, 264, 475

[56] References Cited

U.S. PATENT DOCUMENTS

| | | | |
|---|---|---|---|
| 4,174,541 | 11/1979 | Schmitz | 307/475 |
| 4,321,490 | 3/1982 | Bechdolt | 307/458 |
| 4,368,395 | 1/1983 | Taylor | 307/475 |

Primary Examiner—John Zazworsky
Attorney, Agent, or Firm—Vincent B. Ingrassia

[57] ABSTRACT

In a circuit for converting signals having ECL logic levels to a signal having TTL logic levels, the level shift is accomplished using the base-emitter drops of the transistors employed to avoid the speed degradation that accompanies the use of resistors as level shifters. First and second complementary input ECL signals are applied to first and second transistors respectively. The first input signal results in rendering a drive transistor conductive which turns the source transistor means in a push-pull output stage off and the sink transistor in the output stage on. When the second input signal goes high, current is diverted so as to render the drive transistor nonconductive. Additional circuit means are provided for preventing the sink transistor from saturating and for preventing the input of the source transistor means from falling below a predetermined level. Circuit means are also provided for turning the source transistor means off quickly so as to improve the overall speed performance of the circuit.

9 Claims, 2 Drawing Figures

ECL TO TTL OUTPUT STAGE

BACKGROUND OF THE INVENTION

This invention relates generally to level shifting circuits and, more particularly, to an output stage for receiving signals at emitter coupled logic (ECL) voltage levels and converting them to transistor logic (TTL) logic signals.

As is well known, integrated circuits and systems employing same have become highly sophisticated, and it is often necessary to convert signals produced by a first type of circuitry (e.g. ECL) to signals compatible with a second type of circuitry (e.g. TTL). In the past, it has been necessary to utilize a Schottky or gold doped process in order to produce an integrated circuit for converting ECL to TTL signals which performs at a desired high speed. Unfortunately, such processes are not always available or practical.

ECL circuitry may be considered to produce logical high voltages of approximately 4.6 volts and logical low voltages of approximately 4.2 volts while TTL circuitry produces logical high voltages of approximately 2.8 volts and logical low voltages of approximately 0.4 volts. Normally, circuitry for converting from one level to another employs level shifting resistors or zener diodes. In converting from ECL levels to TTL levels, however, it is necessary to shift down from approximately five volts to ground and therefore zener diodes are not acceptable since they break down at too high a voltage. Additionally, the use of level shifting resistors reduce the operational speed of the circuit. The speed characteristics may be improved somewhat through the use of capacitors; however, such capacitors require a large amount of silicon area and are therefore cumbersome.

SUMMARY OF THE INVENTION

It is an object of the present invention to provide an improved circuit for converting ECL signals to TTL signals.

It is a further object of the present invention to provide a fast ECL to TTL output stage which may be manufactured using a pure linear process.

It is a still further object of the present invention to provide a fast ECL to TTL output stage which does not utilize level shifting resistors or zener diodes.

According to a broad aspect of the invention there is provided a level shifting circuit for receiving first and second input signals each capable of assuming logical high and logical low ECL voltage levels and for generating therefrom an output capable of assuming logical high and logical low TTL voltage levels, comprising a first level shifting transistor responsive to said first input signal; a second level shifting transistor responsive to said first level shifting transistor for producing a drive current; a third level shifting transistor responsive to said first drive current for rendering said third level shifting transistor conductive; a level shifting diode having an anode for receiving current from said third level shifting transistor and having a cathode; a push-pull output stage including source transistor means and sink transistor means for producing said output; a drive transistor responsive to current at said anode for rendering said sink transistor means conductive and said source transistor means nonconductive; and first means responsive to said second input signal for diverting said first drive current so as to render said third level shifting transistor and said drive transistor nonconductive which in turn renders said source transistor means conductive and said sink transistor means nonconductive.

The above and other objects, features and advantages of the present invention will be more clearly understood from the following detailed description taken in conjunction with the accompanying drawings, in which:

DESCRIPTION OF THE PREFERRED EMBODIMENT

Figure 1:
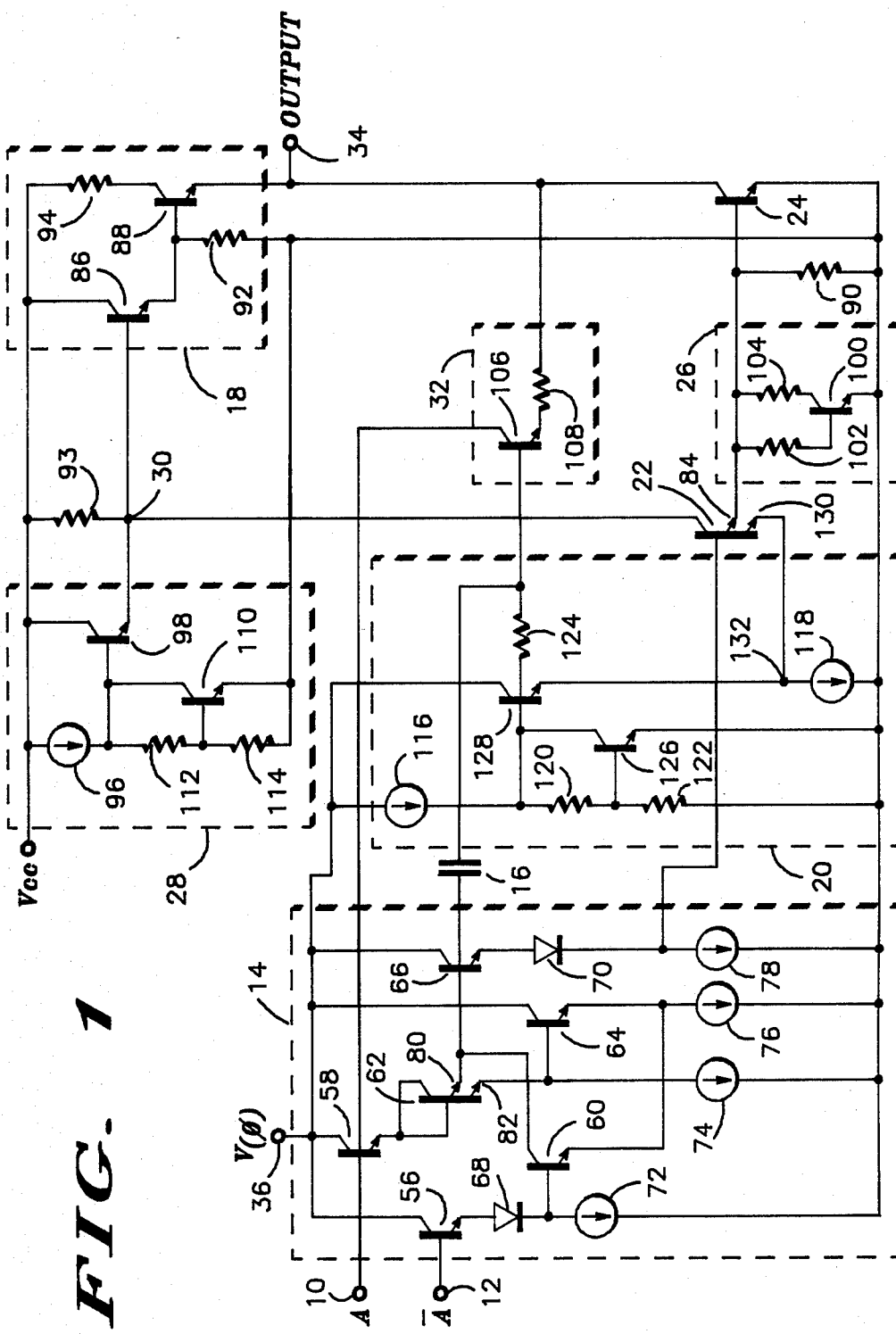
FIG. 1 is a schematic diagram of the inventive ECL to TTL output stage.

The circuit shown in FIG. 1 includes input terminals 10 and 12 for receiving complementary ECL signals (A, $\overline{A}$), an ECL-to-TTL level shifting circuit 14, a low value oscillation prevention capacitor 16, an output source circuit 18, a circuit 20 for improving the speed of operation of source circuit 18, a drive transistor 22, an output sink transistor 24, a bypass network 26 for providing turn-off drive to transistor 24, a first clamping circuit 28 for preventing the voltage at node 30 from falling below a predetermined value, and a second clamping circuit 32 for preventing saturation of sink transistor 24, and an output terminal 34.

A supply voltage $V_{(\phi)}$ is applied to terminal 36 and represents a voltage which is a function of the base-emitter voltage of the transistors utilized on the integrated circuit. Voltage $V_\phi$ which is a regulated voltage and therefore not effected by line voltage variations, may be produced in a number of ways one of which is shown in FIG. 2.

Figure 2:
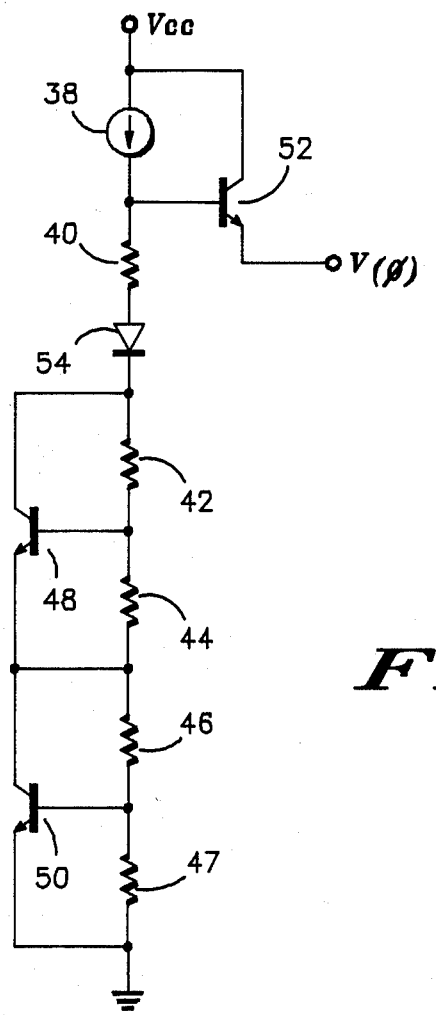
FIG. 2 is a schematic diagram of a voltage regulator circuit for producing a voltage which is a function of the base-emitter voltages of the transistors employed.

The circuit shown in FIG. 2 includes current source 38, resistors 40, 42, 44, 46, and 47, and NPN transistors 48, 50, and 52. The required regulated voltage $V_{(\phi)}$ appears at the emitter of transistor 52 while the collector of transistor 52 is coupled to a supply voltage $V_{cc}$ as is current source 38. Transistor 48, in conjunction with resistors 42 and 44, represent a "N$\phi$ bias network" of the type shown and described in U.S. Pat. No. 3,896,393 entitled "MONOLITHIC POWER AMPLIFIER CAPABLE OF OPERATING CLASS A AND CLASS AB" the teachings of which are hereby incorporated by reference. When transistor 48 is rendered conductive, it generates a voltage across its base and emitter which is designated by the symbol "$\phi$". Since resistor 44 is connected across the base and emitter of transistor 48, a voltage of 1$\phi$ is established thereacross which is in the order of 0.7 volts. Since transistor 48 is a monolithic vertical NPN transistor having a relatively large beta, it may be assumed that its base current is insignificant as compared to the current flowing through resistor 44. The current flowing through resistor 44 must be supplied by resistor 42, and if resistor 42 is chosen to have a value which is N times the value of resistor 44, then N times the voltage developed across resistor 44 must be developed across resistor 42 by their common current. Since the voltage across resistor 44 is 1$\phi$ and the voltage across resistor 42 is N$\phi$, then a voltage of $(N+1)\phi$ may be developed between the collector and emitter electrodes of transistor 48.

Transistor 50 and resistor 46 function in a similar manner. That is, with a voltage of $\phi$ across the base-emitter of transistor 50, a voltage of Nφ may be developed across resistor 46. If we consider the voltage drop across diode 54 as also equivalent to 1φ, then by properly scaling resistors 42, 44 and 46, a voltage of 7φ may be produced at the anode of diode 54. The voltage at the base of transistor 52 may then be considered to be 7φ plus IR where I is current flowing through resistor 40 and R is the value of resistor 40. The voltage at the emitter of transistor 52 is thus 7φ plus IR minus 1φ or 6φ plus IR. The voltage drop across resistor 40 may, for example, be approximately 400 millivolts.

Referring again to FIG. 1, the ECL to TTL level shifting circuitry 14 includes NPN transistors 56, 58, 60, 62, 64, and 66, diodes 68 and 70, and current sources 72, 74, 76, and 78.

Transistor 56 has a base coupled to terminal 12, a collector coupled to $V_{(\phi)}$ at terminal 36 and an emitter coupled to the anode of diode 68 which in turn has a cathode coupled via current source 72 to a second source of supply voltage (e.g. ground). Transistor 58 has a base coupled to input terminal 10, a collector coupled to $V_{(\phi)}$ and an emitter coupled to the base of dual emitter transistor 62. Transistor 62 has its base and collector electrodes coupled together, has a first emitter 80 coupled to the base of transistor 66 and to the collector of transistor 60, and a second emitter 82 coupled to the base of transistor 64 and, via current source 74, to ground. Transistor 60 has a base coupled to the cathode of diode 68 and an emitter coupled to the emitter of transistor 64. The emitter of transistor 64 is coupled via a current source 76 to ground, and the collector of transistor 64 is coupled to $V_{(\phi)}$. Transistor 66 has a collector coupled to $V_{(\phi)}$ and an emitter coupled, via diode 70 and current source 78, to ground. The cathode of diode 70 is coupled to the base of drive transistor 22.

Drive transistor 22 has a collector coupled to the base of transistor 86 and to $V_{cc}$ via resistor 93 and has a first emitter 84 coupled to the base of sink transistor 24. A resistor 90 is coupled between the base of transistor 24 and ground. The collector of transistor 86 is coupled to $V_{cc}$ while its emitter is coupled to the base of transistor 88 and, via resistor 92, to ground. The collector of transistor 88 is coupled via resistor 94 to $V_{cc}$, and the emitter of transistor 88 is coupled to output terminal 34 and to the collector of sink transistor 24.

The above described portion of the circuitry shown in FIG. 1 operates in the following manner. With a logical high (approximately 4.6 volts) at input terminal 10 and with a logical low (approximately 4.2 volts) at input terminal 12, transistor 58 is rendered more conductive and transistor 56 is rendered less conductive. Thus, a drive current is supplied via emitter 80 to the base of transistor 66. Since transistor 56 is less conducting, transistor 60 is off and therefore the drive current being supplied by emitter 80 is not diverted. Thus, transistor 66 is conductive and supplies drive current via diode 70 to the base of drive transistor 22 turning it on. This causes drive current to be supplied to the base of sink transistor 24 and also diverts drive current from the base of transistor 86 causing transistor 88 to become nonconducting. Thus, transistor 24 is turned on causing output terminal 34 to be pulled to very near ground.

When the voltage at input terminal 12 goes high, and the voltage at input 10 goes low, transistor 56 is turned on harder and supplies base drive to transistor 60 rendering transistor 60 conductive. Thus, drive current is diverted from the base of transistor 66 through transistor 60 to ground via current source 76. In this case, transistor 66 is less conductive and causes drive transistor 22 and sink transistor 24 to become nonconductive. Base drive is then supplied by resistor 93 to the base of transistor 86 turning it on which in turn causes current source transistor 88 to be rendered conductive. With transistor 88 conductive and transistor 24 nonconductive, the voltage at output terminal 34 goes high.

Bypass circuit 26 includes NPN transistor 100, base resistor 102 and collector resistor 104 each of which are coupled to the base of sink transistor 24. The emitter of transistor 100 is coupled to ground. This bypass circuit provides turn-off drive for sink transistor 24 in a manner so as to improve the input voltage versus output voltage transfer characteristic. This bypass circuit is described fully in U.S. Pat. No. Re. 27,804 entitled "TRANSISTOR-TRANSISTOR LOGIC CIRCUITS HAVING IMPROVED VOLTAGE TRANSFER CHARACTERISTICS", the teachings of which are hereby incorporated by reference.

It should be apparent that when turning source transistor 88 off, it is only necessary to reduce the voltage at node 30 sufficiently to render NPN transistor 86 less conductive. Once this has been accomplished, further reductions in the voltage at node 30 are undesirable since it will be necessary to raise the voltage at node 30 by an equivalent amount when transistor 86 is to be again rendered conductive. To insure that the voltage at node 30 does not fall below a predetermined value, clamp circuit 28 is provided. As can be seen, clamp circuit 28 comprises current source 96, NPN transistor 98 and "Nφ" circuit of the type described previously including NPN transistor 110 and resistors 112 and 114. This Nφ circuit causes a predetermined voltage to be established at the base of transistor 98 such that when the voltage at node 30 falls 1φ below the predetermined voltage transistor 98 will be rendered conductive thus preventing the voltage at node 30 from falling any further.

Speed up circuit 20 comprises current sources 116 and 118, resistors 120, 122, and 124, and NPN transistors 126 and 128. Current source 116 is coupled between $V_{(\phi)}$ and the base of transistor 128. An Nφ circuit comprising resistors 120 and 122 and transistor 126 is coupled between the base of transistor 128 and ground for establishing a predetermined voltage at the base of transistor 128. Resistor 124 is coupled between the base of transistor 128 and the base of transistor 106. The emitter of transistor 128 is coupled to the second emitter 130 of drive transistor 22 and, via current source 118, to ground.

It should be apparent that transistor 126 in conjunction with resistor 120 and 122 form an Nφ circuit of the type described above for establishing a reference voltage at the base of transistor 128. As long as the voltage at node 132 is at least 1φ less than the voltage at the base of transistor 128 and as long as drive transistor 22 is off, transistor 128 will supply all current required by current source 118. When, however, drive transistor 22 begins to turn on as previously described, current source 118 will begin drawing current through emitter 130 of drive transistor 22 from node 30 (i.e. from the base of transistor 86). This effectuates a rapid turn-off of transistor 86 thus improving the speed of the circuit.

Transistor 106 in conjunction with resistor 108 prevent source sink transistor 24 from saturating. As can be seen, the base of transistor 106 is coupled back to emitter 80 of transistor 62. The collector of transistor 106 is coupled to input terminal 10, and the emitter of transistor 106 is coupled, via resistor 108, to the collector of transistor 24. If the output (terminal 34) should go low, transistor 106 will begin to conduct thus removing input drive. This also results in rendering the output quicker by not permitting sink transistor 24 to saturate.

Finally, capacitor 16 is coupled between the base of transistor 66 and the junction of the base of transistor 106 and resistor 124 to prevent oscillations.

In summary, speed up circuit 20 and clamps 28 and 32 all function to achieve a higher transition speed at output 34, and the ECL supply voltage $V_{(\phi)}$ is made a function of $V_{be}$ thus permitting use of only the base-emitter voltages of transistors in the level shifting stage since the use of resistors would result in a speed reduction.

The above description is given by way of example only. Changes in form and details may be made by one skilled in the art without departing from the scope of the invention.

We claim:

1. A level shifting circuit for receiving first and second input signals each capable of assuming logical high and logical low ECL voltage levels and for generating therefrom an output capable of assuming logical high and logical low TTL voltage levels, comprising:
    a first level shifting transistor responsive to said first input signal;
    a second level shifting transistor responsive to said first level shifting transistor for producing a drive current;
    a third level shifting transistor responsive to said first drive current for rendering said third level shifting transistor conductive;
    a level shifting diode having an anode for receiving current from said third level shifting transistor and having a cathode;
    a push-pull output stage including source transistor means and sink transistor means for producing said output;
    a drive transistor responsive to current at said cathode for rendering said sink transistor means conductive and said source transistor means nonconductive; and
    first means responsive to said second input signal for diverting said first drive current so as to render said third level shifting transistor less conductive and said drive transistor nonconductive which in turn renders said source transistor means conductive and said sink transistor means nonconductive.

2. The circuit according to claim 1 wherein said drive transistor comprises a first transistor having a base coupled to said cathode, an emitter coupled to an input of said sink transistor means, and a collector coupled to an input of said source transistor means.

3. A circuit according to claim 2 wherein said sink transistor means comprises a first transistor having a base coupled to the emitter of said drive transistor, a collector coupled to said source transistor means an an emitter coupled to ground.

4. A circuit according to claim 3 wherein said source transistor means comprises:
    a second transistor having a base coupled to the collector of said drive transistor, a collector adapted to be coupled to a source of supply voltage and an emitter adapted to be coupled to ground; and
    a third transistor having a base coupled to the emitter of said second transistor, a collector adapted to be coupled to said first source of supply voltage, and an emitter coupled to the collector of said first transistor.

5. A circuit according to claim 4 further including voltage limiting means for preventing the voltage at the base of said second transistor from falling below a predetermined value when said drive transistor is rendered conductive.

6. A circuit according to claim 5 further including second means for increasing the speed at which said source transistor means is rendered nonconductive.

7. The circuit according to claim 6 further including antisaturation means coupled between the collector of said sink transistor and said first input signal for preventing said sink transistor from becoming saturated by reducing the drive capability of said first input signal.

8. A circuit according to claim 7 wherein said antisaturation means comprise a fourth transistor having a base coupled to a reference voltage an emitter coupled to the collector of said sink transistor and a collector coupled to said first input signal.

9. A circuit according to claim 8 wherein said means for diverting comprises:
    a fifth transistor having a base coupled to said second input signal, a collector adapted to be coupled to said source of supply voltage and having an emitter;
    a second diode having an anode coupled to the emitter of said fifth transistor and having a cathode; and
    a sixth transistor having a base coupled to the anode of said second diode, a collector coupled to the ouput of said second level shifting transistor and an emitter adapted to be coupled to ground.

* * * * *